United States Patent
Sutou et al.

(10) Patent No.: US 7,528,449 B2
(45) Date of Patent: May 5, 2009

(54) SEMICONDUCTOR DEVICE INCLUDING ESD PROTECTIVE ELEMENT

(75) Inventors: Chie Sutou, Fujisawa (JP); Hirobumi Kawashima, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 93 days.

(21) Appl. No.: 11/581,744

(22) Filed: Oct. 17, 2006

(65) Prior Publication Data

US 2007/0090414 A1    Apr. 26, 2007

(30) Foreign Application Priority Data

Oct. 24, 2005    (JP) .............................. 2005-308629

(51) Int. Cl.
H01L 23/62    (2006.01)
(52) U.S. Cl. ............................... 257/355; 257/E29.112
(58) Field of Classification Search ................. 257/213, 257/288, 355, 356, 357, 358, 359, 360, 361, 257/362, 363, E29.111, E29.112
See application file for complete search history.

(56) References Cited

U.S. PATENT DOCUMENTS 6,864,536 B2 *   3/2005   Lin et al. ..................... 257/355

2003/0202307 A1   10/2003   Hung et al.

FOREIGN PATENT DOCUMENTS

| JP | 7-045829 | 2/1995 |
|---|---|---|
| JP | 2004-71991 | 3/2004 |

* cited by examiner

Primary Examiner—Evan Pert
Assistant Examiner—Kevin Quinto
(74) Attorney, Agent, or Firm—Banner & Witcoff, Ltd

(57) ABSTRACT

A semiconductor device includes a plurality of gate electrodes, source and drain regions, a plurality of source contacts, a plurality of drain contacts, substrate contacts, and a salicide block. The gate electrodes are arrayed in parallel on a semiconductor region on a semiconductor substrate. The source and drain regions are formed in the semiconductor region on both sides of each gate electrode. The source contacts are formed on the source region. The drain contacts are formed on the drain region. The substrate contacts are formed on the semiconductor substrate and electrically connect to the semiconductor substrate. The salicide block is formed between the gate electrode and the plurality of drain contacts. The salicide block prevents silicidation on the drain region. The length of the salicide block in a channel length direction increases as the distance from the substrate contact increases.

19 Claims, 7 Drawing Sheets

SEMICONDUCTOR DEVICE INCLUDING ESD PROTECTIVE ELEMENT

CROSS-REFERENCE TO RELATED APPLICATIONS

This application is based upon and claims the benefit of priority from prior Japanese Patent Application No. 2005-308629, filed Oct. 24, 2005, the entire contents of which are incorporated herein by reference.

BACKGROUND OF THE INVENTION

1. Field of the Invention

The present invention relates to a semiconductor device including an ESD protective element that prevents a current generated by electrostatic discharge (to be referred to as ESD hereinafter) from flowing in a semiconductor circuit.

2. Description of the Related Art

An ESD protective element recently uses a multi-fingered MOS transistor (interdigital MOS transistor) including a plurality of MOS transistors to ensure the gate width in a predetermined area. It is important in the multi-fingered MOS transistor to uniformly operate the MOS transistors. A known means for implementing the uniform operation is a salicide block technique.

The salicide block technique forms a salicide block having a uniform width between gates and drains to uniformly raise the resistance after the MOS transistors operates, thereby reducing the operation variation between the MOS transistors. However, MOS transistors located near the center far from substrate contacts readily operate. Hence, it is difficult to sufficiently reduce the operation variation between the MOS transistors.

There are the following proposals to solve the above-described problem. A technique of partially changing the gate length has been proposed (e.g., U.S. Pre-Grant Publication No. 2003/0202307A1). In this proposal, however, the characteristics of a transistor itself change as the gate length changes.

There is proposed another technique of partially changing the interval between gates and drain contacts (e.g., Jpn. Pat. Appln. KOKAI Publication No. 7-45829). In this method, however, to change the resistance value in the drain region, the distance between the gates and drains before the change of interval need to be long because the length of the silicide region changes.

BRIEF SUMMARY OF THE INVENTION

According to a first aspect of the present invention, there is provided a semiconductor device comprising: a plurality of gate electrodes which are arrayed in parallel on a semiconductor region on a semiconductor substrate; a source region and a drain region which are formed in the semiconductor region on both sides of each gate electrode; a plurality of source contacts which are formed on the source region; a plurality of drain contacts which are formed on the drain region; a plurality of substrate contacts which are formed on the semiconductor substrate and electrically connect to the semiconductor substrate; and a salicide block formed between the gate electrode and the plurality of drain contacts, the salicide block preventing silicidation on the drain region and having a length in a channel length direction that increases as a distance from the substrate contact increases.

According to a second aspect of the present invention, there is provided a semiconductor device comprising: a plurality of gate electrodes which are arrayed in parallel on a semiconductor region on a semiconductor substrate; a source region and a drain region which are formed in the semiconductor region on both sides of each gate electrode; a plurality of source contacts which are formed on the source region; a plurality of drain contacts which are formed on the drain region; a plurality of first substrate contacts which are formed on the semiconductor substrate and electrically connect to the semiconductor substrate, the first substrate contacts being arrayed in a direction perpendicular to the plurality of gate electrodes; and a salicide block formed between the gate electrode and the plurality of drain contacts, the salicide block preventing silicidation on the drain region and having a length in a channel length direction that increases as a distance from the first substrate contact increases.

According to a third aspect of the present invention, there is provided a semiconductor device comprising: a plurality of gate electrodes which are arrayed in parallel on a semiconductor region on a semiconductor substrate; a source region and a drain region which are formed in the semiconductor region on both sides of each gate electrode; a plurality of source contacts which are formed on the source region; a plurality of drain contacts which are formed on the drain region; a plurality of first substrate contacts which are formed on the semiconductor substrate and electrically connect to the semiconductor substrate, the first substrate contacts being arrayed in a direction parallel to the plurality of gate electrodes; a plurality of second substrate contacts which are formed on the semiconductor substrate and electrically connect to the semiconductor substrate, the second substrate contacts being arrayed in a direction perpendicular to the plurality of gate electrodes; and a salicide block formed between the gate electrode and the plurality of drain contacts, the salicide block preventing silicidation on the drain region and having a length in a channel length direction that increases as distances from the first substrate contacts and the second substrate contacts increase.

DETAILED DESCRIPTION OF THE INVENTION

Figure 1:
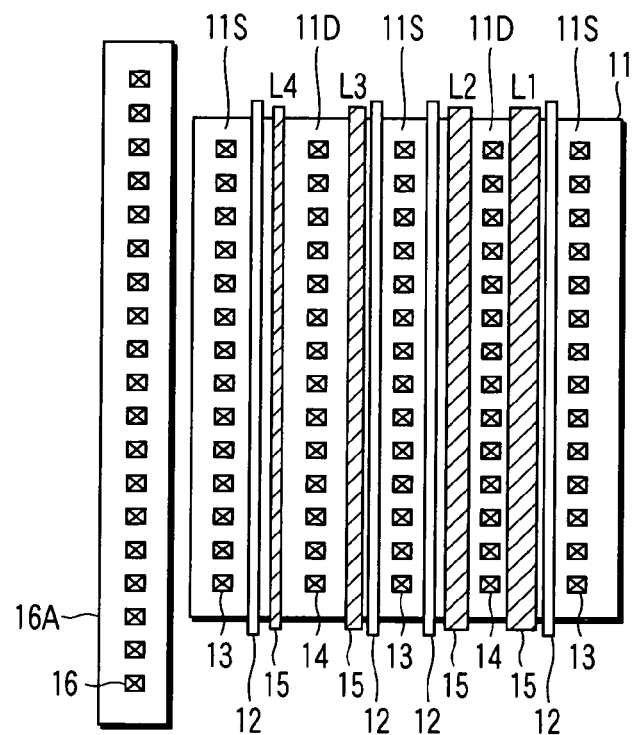
FIG. 1 is a plan view showing the structure of an ESD protective element according to a first embodiment of the present invention.

A semiconductor device including an ESD protective element according to an embodiment of the present invention will be described below. In the following description, the same reference numerals denote the same parts throughout the drawing.

First Embodiment

A multi-fingered MOS transistor (interdigital MOS transistor) serving as an ESD protective element according to the first embodiment of the present invention will be described.

FIG. 1 is a plan view showing the structure of an ESD protective element according to the first embodiment.

An active region 11 is formed on a semiconductor substrate. Gate electrodes 12 are formed on a gate insulating film (not shown) on the active region 11. The gate electrodes 12 form the gates of a plurality of MOS transistors. A source diffusion region 11S and drain diffusion region 11D are formed in the active region on both sides of each gate electrode 12. Source contacts 13 are formed on each source diffusion region 11S. Drain contacts 14 are formed on each drain diffusion region 11D. FIG. 1 does not illustrate the gate insulating film on the source diffusion regions 11S and drain diffusion regions 11D.

Salicide blocks 15 are formed between the gate electrodes 12 and the drain contacts 14. To reduce the electric resistance of the sources and drains, a silicide film is formed on the source diffusion regions 11S and drain diffusion regions 11D by a salicide process. In the salicide process, silicide film formation on the drain diffusion regions 11D can be prevented by forming the salicide blocks 15 in advance. It is possible to adjust the electric resistance of the drains by changing the length of the salicide block 15 in the source-drain direction (channel length direction).

A plurality of MOS transistors each including the gate electrode 12, source contact 13, drain contact 14, and salicide block 15 are formed along the plurality of gate electrodes 12.

A diffusion region 16A to ensure contact with the semiconductor substrate is formed on one side of the active region 11 having the plurality of MOS transistors. A plurality of substrate contacts 16 are formed on the diffusion region 16A. The substrate contacts 16 are arrayed in parallel to the gate electrodes 12. The substrate contacts 16 electrically connect to the back gates (bulk) of the MOS transistors formed on the active region 11.

The salicide blocks 15 have larger widths as the distance from the substrate contacts 16 increases, as shown in FIG. 1. Let L1 be the width of the salicide block 15 farthest from the substrate contacts 16. The width changes to L2, L3, and L4 as the distance from the substrate contacts 16 decreases. In this case, L4<L3<L2<L1.

In the ESD protective element with such a structure that the salicide blocks 15 have larger widths as the distance from the substrate contacts 16 increases, the drain resistance of the MOS transistors increases as the distance from the substrate contacts 16 increases. Hence, the resistance value after operation is larger in the MOS transistors having the salicide block with the width L1 than in the MOS transistors having the salicide block with the width L2. Similarly, the resistance value after operation is larger in the MOS transistors having the salicide block with the width L2 than in the MOS transistors having the salicide block with the width L3 and in the MOS transistors having the salicide block with the width L3 than in the MOS transistors having the salicide block with the width L4. This can reduce the operation variation between the MOS transistors in the multi-fingered MOS transistor so that the MOS transistors can uniformly operate.

ESD protective elements according to modifications to the first embodiment of the present invention will be described next.

Figure 2:
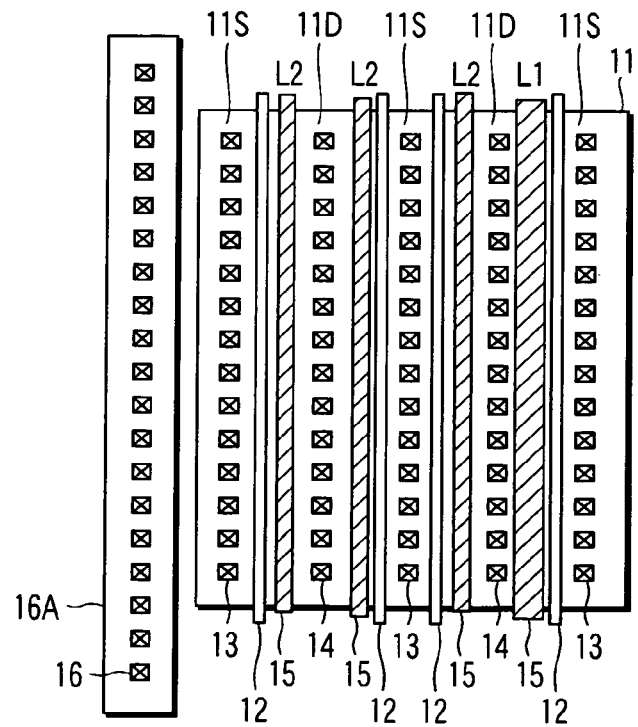
FIG. 2 is a plan view showing the structure of an ESD protective element according to a first modification to the first embodiment.

FIG. 2 is a plan view showing the structure of an ESD protective element according to the first modification to the first embodiment.

The salicide blocks 15 are formed between the gate electrodes 12 and the drain contacts 14. The widths of the salicide blocks 15 change in two steps as the distance from the substrate contacts 16 increases. Let L1 be the width of the salicide block 15 farthest from the substrate contacts 16, and L2 be the width of the salicide blocks 15 closer to the substrate contacts 16. In this case, L2<L1.

The resistance value after operation is larger in the MOS transistors having the salicide block with the width L1 than in the MOS transistors having the salicide block with the width L2. This can reduce the operation variation between the MOS transistors in the multi-fingered MOS transistor shown in FIG. 2 so that the MOS transistors can uniformly operate. In the above-described example, the salicide block widths change in two steps. However, the widths may change in any other multiple steps including three or four steps.

Figure 3A:
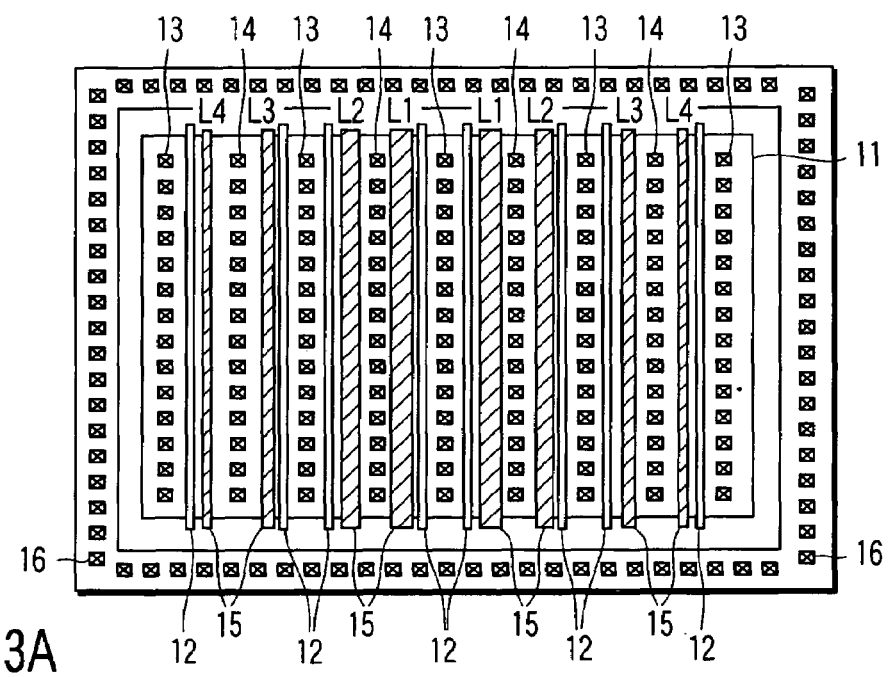
FIG. 3A is a plan view showing the structure of an ESD protective element according to a second modification to the first embodiment.

FIG. 3A is a plan view showing the structure of an ESD protective element according to the second modification to the first embodiment.

The substrate contacts 16 surround the active region 11 having the plurality of MOS transistors. The salicide blocks 15 have larger widths as the distance from the substrate contacts 16 which are formed adjacent to both ends of the active region 11 while being arrayed in parallel to the gate electrodes 12 increases toward the center.

Let L1 be the width of the salicide block 15 farthest from the substrate contacts 16 at both ends. The width of the salicide block 15 changes to L2, L3, and L4 as the distance from the substrate contacts 16 decreases. In this case, L4<L3<L2<L1.

The resistance value after operation is larger in the MOS transistors having the salicide block with the width L1 than in the MOS transistors having the salicide block with the width L2. Similarly, the resistance value after operation is larger in the MOS transistors having the salicide block with the width L2 than in the MOS transistors having the salicide block with the width L3 and in the MOS transistors having the salicide block with the width L3 than in the MOS transistors having the salicide block with the width L4. This can reduce the operation variation between the MOS transistors in the multi-fingered MOS transistor shown in FIG. 3A so that the MOS transistors can uniformly operate. In the example shown in FIG. 3A, the salicide block widths change in four steps. However, the widths may change in any other multiple steps including two steps.

Figure 3B:
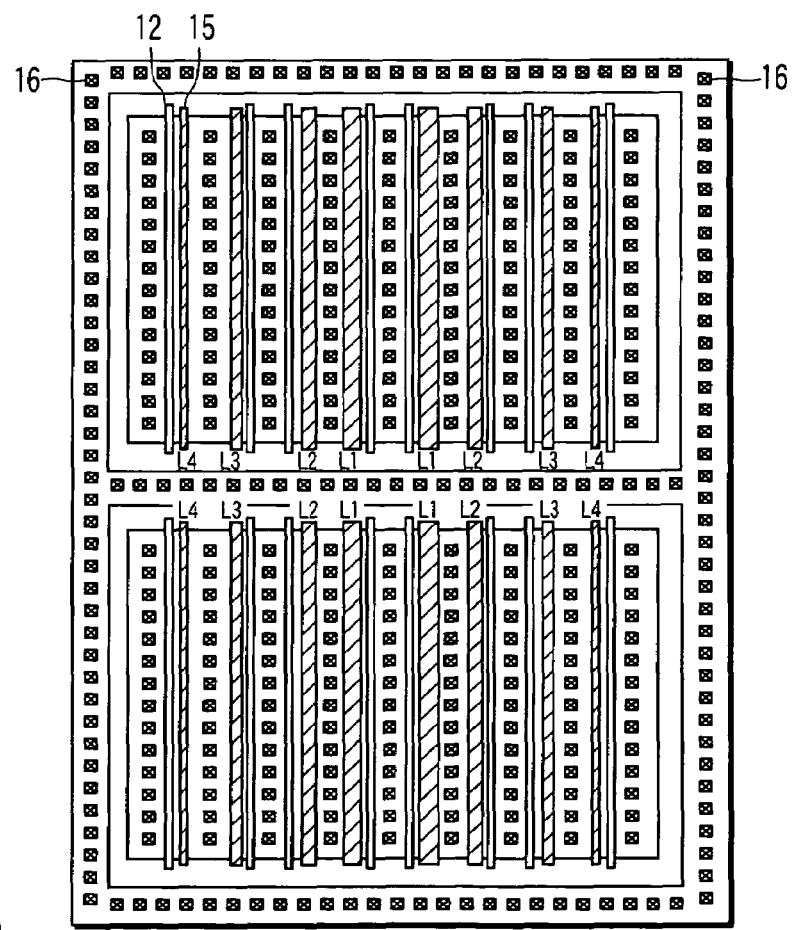
FIG. 3B is a plan view showing an example wherein ESD protective elements shown in FIG. 3A are formed in two steps in the running direction of the gate electrodes.

FIG. 3B is a plan view showing an example wherein multi-fingered MOS transistors shown in FIG. 3A are formed in two steps in the running direction of the gate electrodes 12.

As shown in FIG. 3B, even in the example including two steps of multi-fingered MOS transistors (with element isolation), the salicide blocks 15 at the center farthest from the substrate contacts 16 at both ends have the largest width. The width of the salicide block 15 gradually decreases to L2, L3, and L4 toward the substrate contacts 16 (L1>L2>L3>L4). This can reduce the operation variation between the MOS transistors in the multi-fingered MOS transistor shown in FIG. 3B so that the MOS transistors can uniformly operate. In the example shown in FIG. 3B, the salicide block widths change in four steps. However, the widths may change in any other multiple steps including two steps.

Second Embodiment

A fingered MOS transistor serving as an ESD protective element according to the second embodiment of the present invention will be described next. The same reference numerals as in the first embodiment denote the same parts in the second embodiment, and a description thereof will be omitted.

Figure 4:
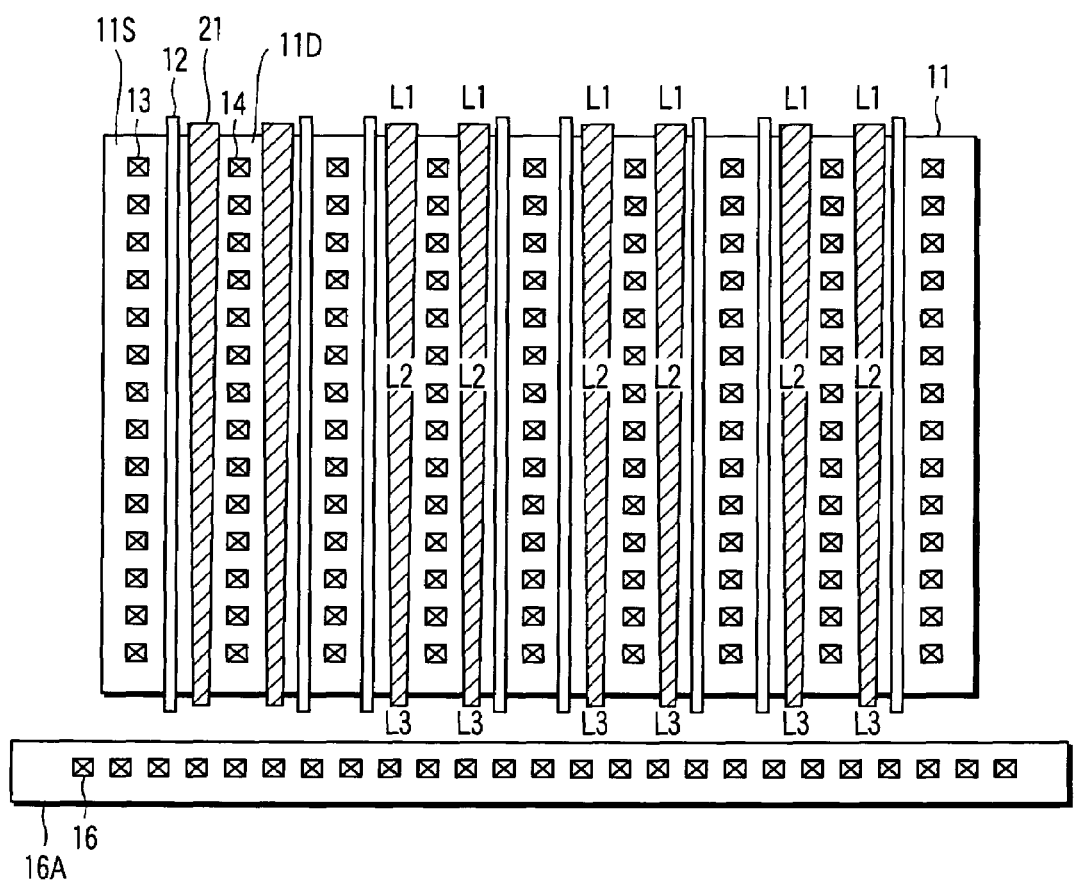
FIG. 4 is a plan view showing the structure of an ESD protective element according to a second embodiment of the present invention.

FIG. 4 is a plan view showing the structure of an ESD protective element according to the second embodiment.

A diffusion region 16A and a plurality of substrate contacts 16 are formed in the vicinity of an active region 11 having a plurality of MOS transistors while being arrayed in a direction perpendicular to gate electrodes 12. Salicide blocks 21 are formed between the gate electrodes 12 and drain contacts 14. Each salicide block 21 has a larger width as the distance from the substrate contacts 16 increases. That is, each salicide block 21 has a trapezoidal shape. Let L3 be the width of the portion nearest to the substrate contacts 16, L2 be the width of the central portion, and L1 be the width of the farthest portion. In this case, L3<L2<L1.

The resistance value after operation is larger in the MOS transistors having the salicide block with the width L1 than in the MOS transistors having the salicide block with the width L2. Similarly, the resistance value after operation is larger in the MOS transistors having the salicide block with the width L2 than in the MOS transistors having the salicide block with the width L3. This can reduce the operation variation between the MOS transistors in the multi-fingered MOS transistor independently of the distance from the substrate contacts 16 so that the MOS transistors can uniformly operate.

Third Embodiment

A fingered MOS transistor serving as an ESD protective element according to the third embodiment of the present invention will be described next. The same reference numerals as in the first embodiment denote the same parts in the third embodiment, and a description thereof will be omitted.

Figure 5:
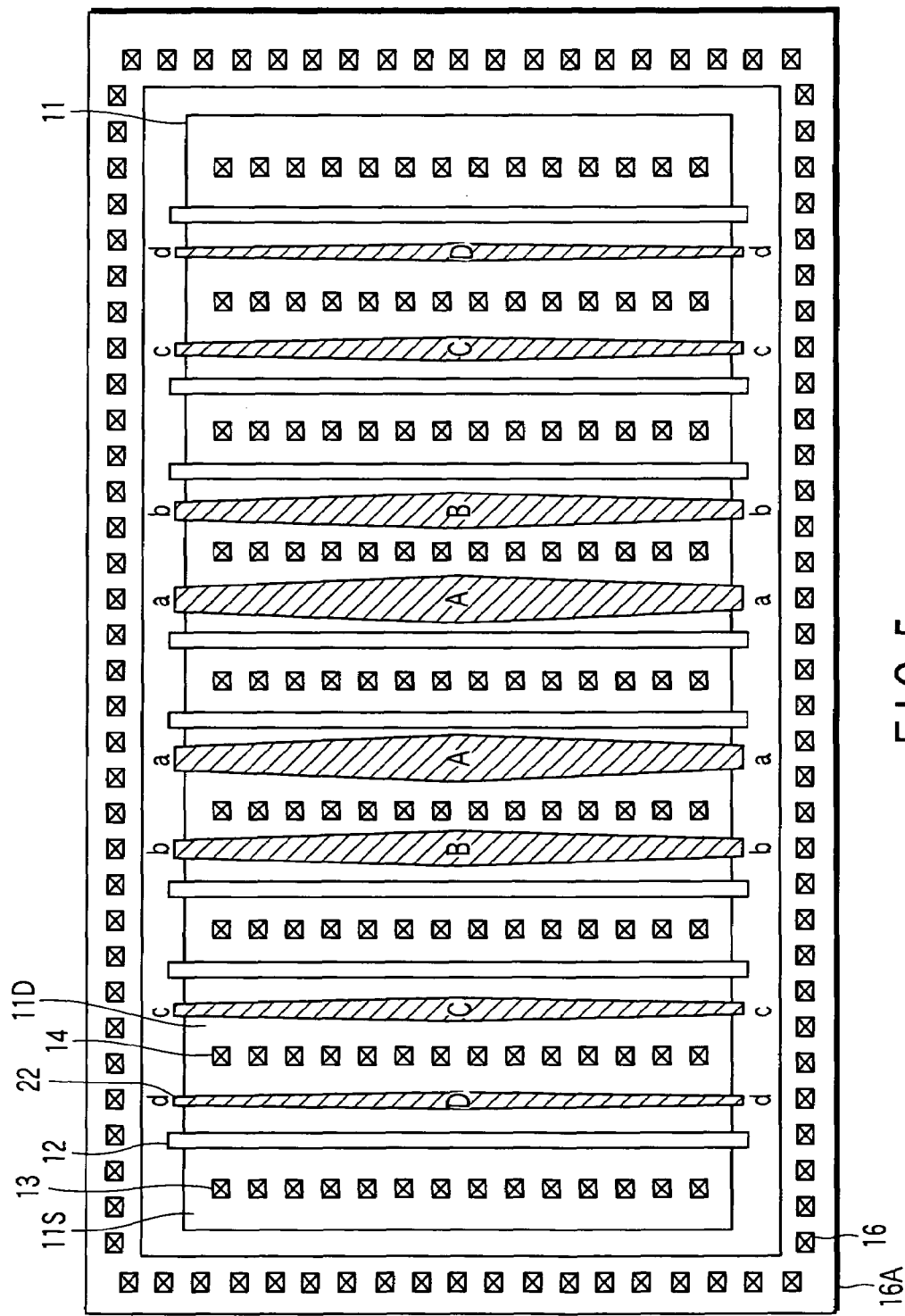
FIG. 5 is a plan view showing the structure of an ESD protective element according to a third embodiment of the present invention.

FIG. 5 is a plan view showing the structure of an ESD protective element according to the third embodiment.

A diffusion region 16A and a plurality of substrate contacts 16 surround an active region 11 having a plurality of MOS transistors. Salicide blocks 22 are formed between gate electrodes 12 and drain contacts 14. Each salicide block 22 has a larger width as the distances from the substrate contacts 16 increases. More specifically, the salicide blocks 22 have larger widths, toward the center, from the sides close to the plurality of substrate contacts 16 formed in parallel to the gate electrodes 12. In addition, each salicide block 22 has a larger width, toward its center, from the sides of the plurality of substrate contacts 16 formed in a direction perpendicular to the gate electrodes 12. As shown in FIG. 5, let A, B, C, and D be the widths of the central portions of the salicide blocks 22, and a, b, c, and d be the widths of both ends. In this case, D<C<B<A, A>a, B>b, C>c, and D>d. That is, the width of each salicide block 22 changes in consideration of the distances from the substrate contacts 16 around it.

In the ESD protective element with this structure, the resistance value after operation is larger in the MOS transistors having the salicide block with the width A than in the MOS transistors having the salicide block with the width B. Similarly, the resistance value after operation is larger in the MOS transistors having the salicide block with the width B than in the MOS transistors having the salicide block with the width C and in the MOS transistors having the salicide block with the width C than in the MOS transistors having the salicide block with the width D. Additionally, the resistance value after operation is larger in the MOS transistors having the salicide block with the width a than in the MOS transistors having the salicide block with the width b. Similarly, the resistance value after operation is larger in the MOS transistors having the salicide block with the width b than in the MOS transistors having the salicide block with the width c and in the MOS transistors having the salicide block with the width c than in the MOS transistors having the salicide block with the width d. Furthermore, the resistance value after operation is larger in the MOS transistors having the salicide block with the width A than in the MOS transistors having the salicide block with the width a. Similarly, the resistance value after operation is larger in the MOS transistors having the salicide block with the width B than in the MOS transistors having the salicide block with the width b, in the MOS transistors having the salicide block with the width C than in the MOS transistors having the salicide block with the width c, and in the MOS transistors having the salicide block with the width D than in the MOS transistors having the salicide block with the width d. This can reduce the operation variation between the MOS transistors in the multi-fingered MOS transistor independently of the distance from the substrate contacts so that the MOS transistors can uniformly operate.

An ESD protective element according to a modification to the third embodiment of the present invention will be described next.

Figure 6:
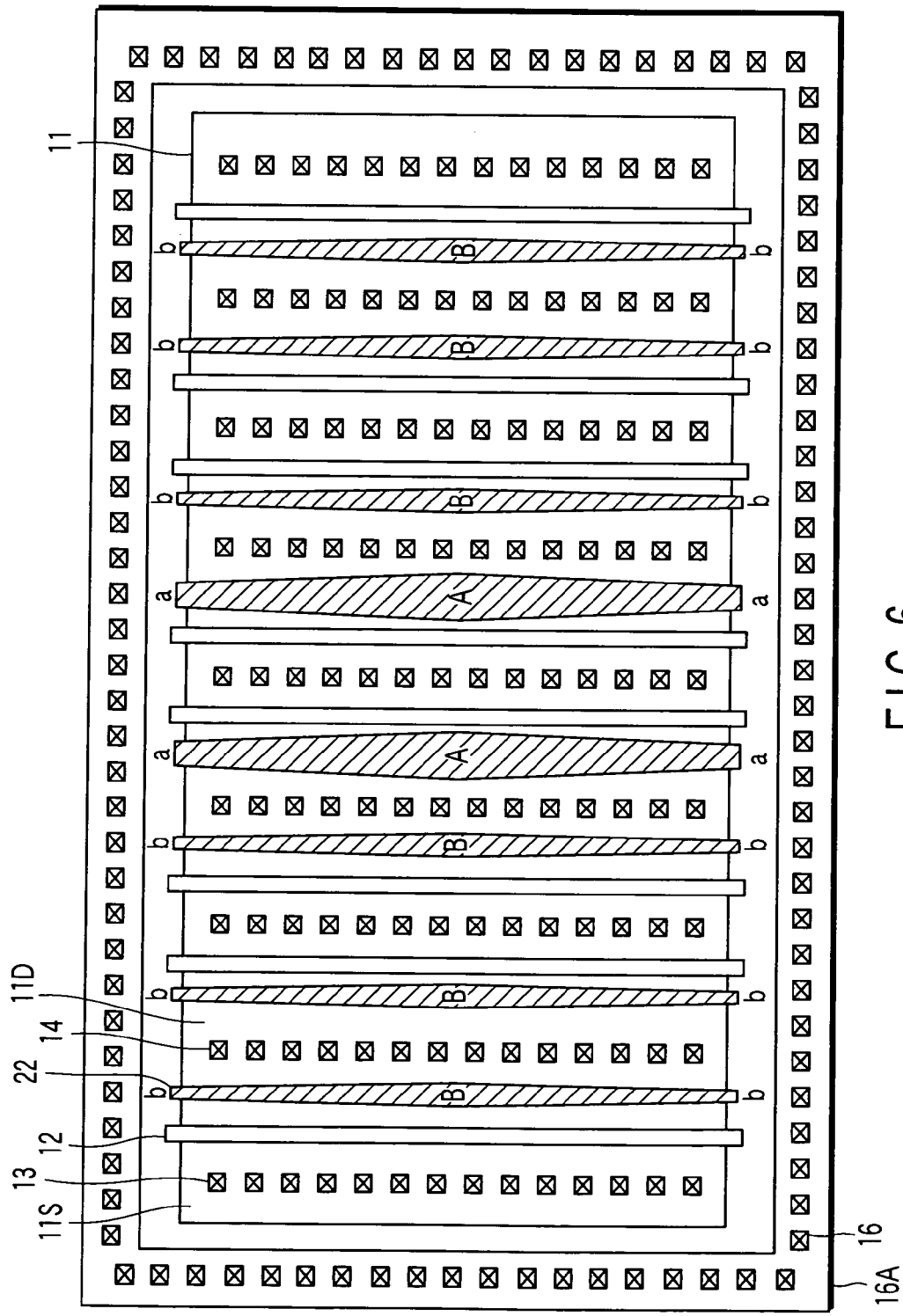
FIG. 6 is a plan view showing the structure of an ESD protective element according to a modification to the third embodiment.

FIG. 6 is a plan view showing the structure of an ESD protective element according to a modification to the third embodiment.

The salicide blocks 22 are formed between the gate electrodes 12 and the drain contacts 14. The widths of the salicide blocks 22 change in two steps as the distance from the substrate contacts 16 formed in parallel to the gate electrodes 12 increases. Let A be the width of the central portion of the salicide block 22 farthest from the substrate contacts 16, and a be the widths of both ends of the salicide block 22. Let B be the width of the central portion of the salicide block 22 closer to the substrate contacts 16 formed in parallel to the gate electrodes 12, and b be the widths of both ends of the salicide block 22. In this case, B<A, A>a, and B>b.

The resistance value after operation is larger in the MOS transistors having the salicide block with the width A than in the MOS transistors having the salicide block with the width B. Additionally, the resistance value after operation is larger in the MOS transistors having the salicide block with the width a than in the MOS transistors having the salicide block with the width b. Furthermore, the resistance value after operation is larger in the MOS transistors having the salicide block with the width A than in the MOS transistors having the salicide block with the width a. Similarly, the resistance value after operation is larger in the MOS transistors having the salicide block with the width B than in the MOS transistors having the salicide block with the width b. This can reduce the operation variation between the MOS transistors in the multi-fingered MOS transistor independently of the distance from the substrate contacts so that the MOS transistors can uniformly operate. In the above-described example, the salicide block widths change in two steps. However, the widths may change in any other multiple steps including three or four steps. In addition, the multi-fingered MOS transistors shown in FIGS. 5 and 6 may be formed in two steps in the running direction of the gate electrodes 12, as shown in FIG. 3B.

Fourth Embodiment

As an ESD protective element according to the fourth embodiment of the present invention, examples having different substrate contact formation regions will be described below. The same reference numerals as in the first embodiment denote the same parts in the fourth embodiment, and a description thereof will be omitted.

Figure 7:
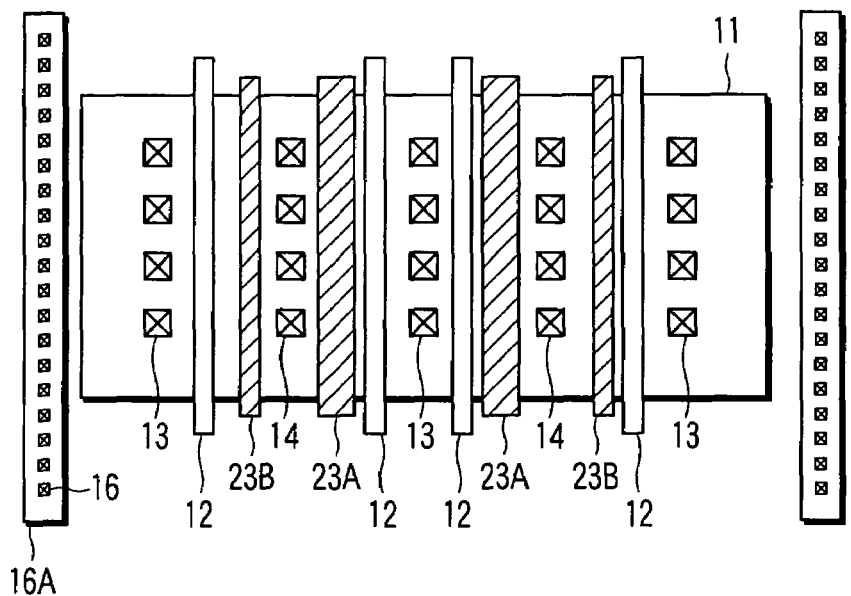
FIG. 7 is a plan view showing a first structural example of an ESD protective element according to the fourth embodiment of the present invention.

FIG. 7 shows an example wherein substrate contacts 16 are formed in the vicinity of two ends of an active region 11 having a multi-fingered MOS transistor while being arrayed in parallel to gate electrodes 12.

Salicide blocks 23A and 23B have larger widths as the distance from the substrate contacts 16 at both ends increases. More specifically, the salicide blocks 23A closer to the center have larger widths than the salicide blocks 23B on the sides of the substrate contacts 16. Hence, the resistance value after operation is larger in the MOS transistors having the salicide block 23A closer to the center than in the MOS transistors having the salicide block 23B on the side of the substrate contacts 16. This can reduce the operation variation between the MOS transistors in the multi-fingered MOS transistor independently of the distance from the substrate contacts 16 so that the MOS transistors can uniformly operate. In the above-described example, the salicide block widths change in two steps as the distance from the substrate contacts 16 at both ends increases. However, the present invention is not limited to this. If the number of gate electrodes 12 increases, the widths may change in three or more steps.

Figure 8:
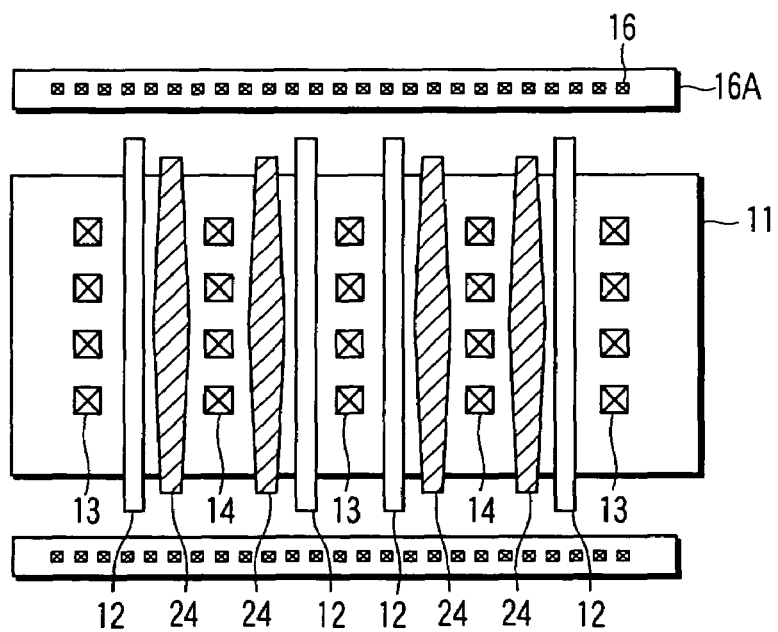
FIG. 8 is a plan view showing a second structural example of an ESD protective element according to the fourth embodiment of the present invention.

FIG. 8 shows an example wherein the substrate contacts 16 are formed in the vicinity of two ends of the active region 11 having a multi-fingered MOS transistor while being arrayed in a direction perpendicular to the gate electrodes 12.

Each salicide block 24 has a larger width as the distance from the substrate contacts 16 at both ends increases. More specifically, each salicide block 24 has a larger width from the sides of the substrate contacts 16 toward its center. Hence, the resistance value after operation is larger in the MOS transistors having the salicide block closer to the center than in the MOS transistors having the salicide block on the side of the substrate contacts 16. This can reduce the operation variation between the MOS transistors in the multi-fingered MOS transistor independently of the distance from the substrate contacts 16 so that the MOS transistors can uniformly operate.

Figure 9:
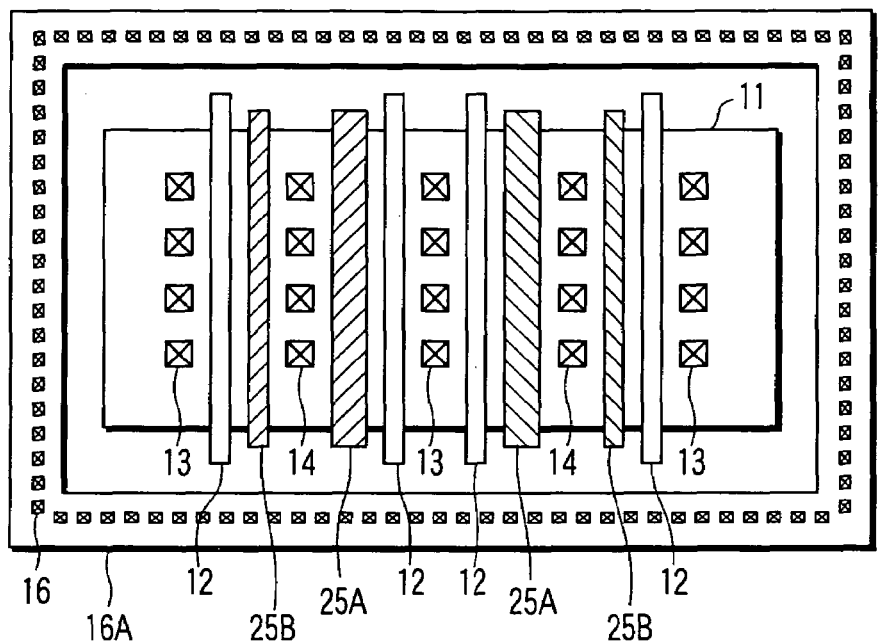
FIG. 9 is a plan view showing a third structural example of an ESD protective element according to the fourth embodiment of the present invention.

FIG. 9 shows an example wherein the substrate contacts 16 are formed around the active region 11 having a multi-fingered MOS transistor.

The substrate contacts 16 surround the active region 11 having a plurality of MOS transistors. Salicide blocks 25A and 25B have larger widths as the distance from the substrate contacts 16 increases. More specifically, the salicide blocks 25A closer to the center have larger widths than the salicide blocks 25B on the sides of the substrate contacts 16 formed in parallel to the gate electrodes 12. Hence, the resistance value after operation of the MOS transistors increases from the sides of the substrate contacts 16 toward the center. This can reduce the operation variation between the MOS transistors in the multi-fingered MOS transistor independently of the distance from the substrate contacts 16 so that the MOS transistors can uniformly operate. In the example shown in FIG. 9, the salicide blocks are rectangular. The shape is not limited to a rectangle and may be a hexagon. A hexagonal salicide block is obtained by increasing the width of each salicide block as the distances from the substrate contacts 16 in directions parallel and perpendicular to the gate electrodes 12 increase.

Figure 10:
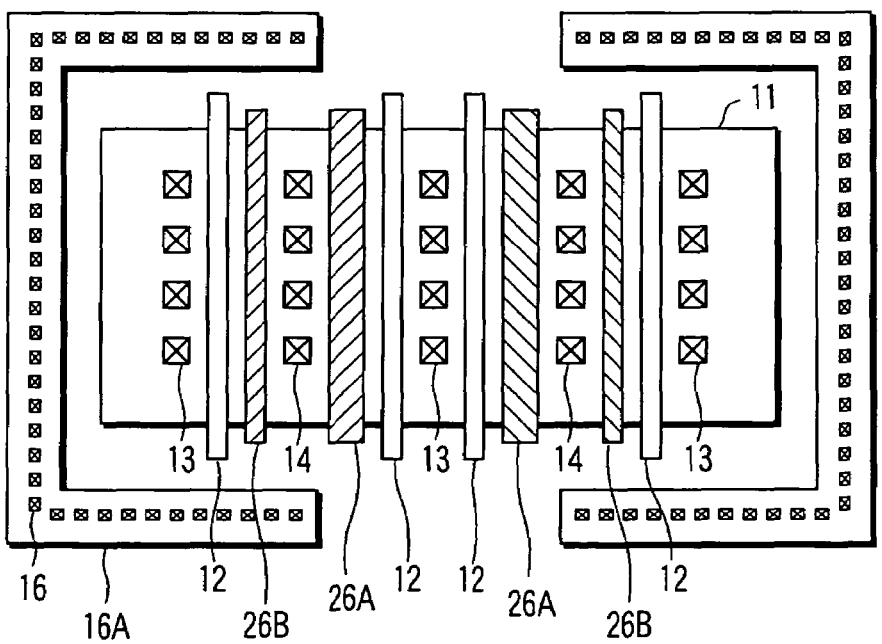
FIG. 10 is a plan view showing a fourth structural example of an ESD protective element according to the fourth embodiment of the present invention.

FIG. 10 shows an example wherein the substrate contacts 16 are formed around the active region 11 having a multi-fingered MOS transistor except at the central portion in a direction perpendicular to the gate electrodes 12.

The substrate contacts 16 are formed in the vicinity of the active region 11 having a plurality of MOS transistors while being arrayed in parallel to the gate electrodes 12. The substrate contacts 16 are also formed in a direction perpendicular to the gate electrodes 12 except at the central portion. Like the example shown in FIG. 9, salicide blocks 26A and 26B have larger widths as the distance from the substrate contacts 16 increases. More specifically, the salicide blocks 26A closer to the center have larger widths than the salicide blocks 26B on the sides of the substrate contacts 16 formed in parallel to the gate electrodes 12. Hence, the resistance value after operation of the MOS transistors increases from the sides of the substrate contacts 16 toward the center. This can reduce the operation variation between the MOS transistors in the multi-fingered MOS transistor independently of the distance from the substrate contacts 16 so that the MOS transistors can uniformly operate.

In the example shown in FIG. 10, of the substrate contacts surrounding the active region 11, the substrate contacts arrayed in the direction perpendicular to the gate electrodes 12 are formed except at the central portion. However, the present invention is not limited to this. The substrate contacts can be omitted in an arbitrary region.

In the example shown in FIG. 10, the salicide blocks are rectangular. The shape is not limited to a rectangle and may be a hexagon. A hexagonal salicide block is obtained by increasing the width of each salicide block as the distances from the substrate contacts 16 in directions parallel and perpendicular to the gate electrodes 12 increase.

According to the embodiments of the present invention, a semiconductor device can be provided, which includes an ESD protective element having a multi-fingered structure with a plurality of MOS transistors and capable of uniformly operating the MOS transistors.

Each of the above embodiments can independently be practiced. However, they may appropriately be combined. The above-described embodiments incorporate inventions of various stages, and inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a plurality of gate electrodes which are arrayed in parallel on a semiconductor region on a semiconductor substrate;

a source region and a drain region which are formed in the semiconductor region on both sides of each gate electrode;
a plurality of source contacts which are formed on the source region;
a plurality of drain contacts which are formed on the drain region;
a plurality of substrate contacts which are formed on the semiconductor substrate and electrically connect to the semiconductor substrate; and
a salicide block formed between the gate electrode and the plurality of drain contacts, the salicide block preventing silicidation on the drain region
wherein the salicde block comprises a first salicide block which is spaced apart from the substrate contacts by a predetermined distance, and a second salicide block which is spaced apart from the substrate contacts by a distance longer than the predetermined distance, and
a length of the second salicide block in a channel length directions is larger than that of the first salicide block.

2. The device according to claim 1,
wherein a MOS transistor including the gate electrode, the source contact, the drain contact, and the salicide block is formed, and
the substrate contacts are arrayed in parallel to the gate electrode on at least one end side of the semiconductor region with the MOS transistor.

3. The device according to claim 2, wherein the substrate contacts are arrayed in a direction perpendicular to the gate electrode.

4. The device according to claim 1, wherein the length of the salicide block in a channel length direction changes in at least two steps as the distance from the substrate contacts increases.

5. The device according to claim 1, wherein the salicide block has a rectangular shape, and the length of the salicide block in a channel length direction corresponds to a widthwise length of the rectangular shape.

6. The device according to claim 1, wherein the semiconductor device forms an ESD protective element that prevents a current generated by electrostatic discharge from flowing in.

7. A semiconductor device comprising:
a plurality of gate electrodes which are arrayed in parallel on a semiconductor region on a semiconductor substrate;
a source region and a drain region which are formed in the semiconductor region on both sides of each gate electrode;
a plurality of source contacts which are formed on the source region;
a plurality of drain contacts which are formed on the drain region;
a plurality of first substrate contacts which are formed on the semiconductor substrate and electrically connect to the semiconductor substrate, the first substrate contacts being arrayed in a direction perpendicular to the plurality of gate electrodes; and
a salicide block formed between the gate electrode and the plurality of drain contacts, the salicide block preventing silicidation on the drain region and having a length in a channel length direction that increases as a distance from the first substrate contacts increases.

8. The device according to claim 7, wherein the length of the salicide block in a channel length direction at a first part spaced apart from the substrate contact by a predetermined distance is smaller than that of a second part spaced apart from the substrate contact by a distance longer than the predetermined distance.

9. The device according to claim 7, wherein the salicide block has a rectangular shape, and the length of the salicide block in a channel length direction corresponds to a widthwise length of the rectangular shape.

10. The device according to claim 7, wherein the semiconductor device forms an ESD protective element that prevents a current generated by electrostatic discharge from flowing in.

11. The device according to claim 7,
wherein a MOS transistor including the gate electrode, the source contact, the drain contact, and the salicide block is formed, and
the first substrate contacts are arrayed on at least one end side of the semiconductor region with the MOS transistor.

12. The device according to claim 11, further comprising a plurality of second substrate contacts which are arrayed on the other end side of the semiconductor region with the MOS transistor in a direction perpendicular to the gate electrodes, and
the length of the salicide block in a channel length direction maximizes at an intermediate point between the first substrate contact and the second substrate contact and decreases from the intermediate point toward the first substrate contact and the second substrate contact.

13. A semiconductor device comprising:
a plurality of gate electrodes which are arrayed in parallel on a semiconductor region on a semiconductor substrate;
a source region and a drain region which are formed in the semiconductor region on both sides of each gate electrode;
a plurality of source contacts which are formed on the source region;
a plurality of drain contacts which are formed on the drain region;
a plurality of first substrate contacts which are formed on the semiconductor substrate and electrically connect to the semiconductor substrate, the first substrate contacts being arrayed in a direction parallel to the plurality of gate electrodes;
a plurality of second substrate contacts which are formed on the semiconductor substrate and electrically connect to the semiconductor substrate, the second substrate contacts being arrayed in a direction perpendicular to the plurality of gate electrodes; and
a salicide block formed between the gate electrode and the plurality of drain contacts, the salicide block preventing silicidation on the drain region and having a length in a channel length direction that increases as distances from the first substrate contacts and the second substrate contacts increase.

14. The device according to claim 13, wherein
the salicide block comprises a first salicide block which is spaced apart from the first substrate contact by a predetermined distance, and a second salicide block which is spaced apart from the first substrate contact by a distance longer than the predetermined distance, and
a length of the second salicide block in a channel length direction is longer than that of the first salicide block.

15. The device according to claim 13, wherein the length of the salicide block in a channel length direction changes in at least two steps as the distance from the first substrate contact increases.

16. The device according to claim 13, wherein the salicide block has a rectangular shape, and the length of the salicide block in a channel length direction corresponds to a widthwise length of the rectangular shape.

17. The device according to claim 13, wherein the semiconductor device forms an ESD protective element that prevents a current generated by electrostatic discharge from flowing in.

18. The device according to claim 13,
wherein a MOS transistor including the gate electrode, the source contact, the drain contact, and
the salicide block is formed, and the first substrate contacts and the second substrate contacts are arrayed on end sides of the semiconductor region with the MOS transistor.

19. The device according to claim 18, further comprising a plurality of third substrate contacts which are formed on an end side of the semiconductor substrate with the MOS transistor, the third substrate contacts being arrayed in the direction perpendicular to the gate electrodes so as to face the second substrate contacts,
wherein the length of the salicide block in a channel length direction maximizes at an intermediate point between the second substrate contact and the third substrate contact and decreases from the intermediate point toward the second substrate contact and the third substrate contact.

* * * * *

UNITED STATES PATENT AND TRADEMARK OFFICE
CERTIFICATE OF CORRECTION

PATENT NO. : 7,528,449 B2
APPLICATION NO. : 11/581744
DATED : May 5, 2009
INVENTOR(S) : Chic Sutou et al.

Page 1 of 1

It is certified that error appears in the above-identified patent and that said Letters Patent is hereby corrected as shown below:

In Column 9, Claim 1, Line 20:
    Please delete "directions" and insert --direction--

Signed and Sealed this

Seventeenth Day of November, 2009

David J. Kappos
*Director of the United States Patent and Trademark Office*